United States Patent [19]

Worcester et al.

[11] 4,045,735
[45] Aug. 30, 1977

[54] APPARATUS FOR TESTING ELECTRONIC DEVICES HAVING A HIGH DENSITY ARRAY OF PIN LEADS

[75] Inventors: John L. Worcester, Walnut Creek; John C. Hubbs, Lafayette, both of Calif.

[73] Assignee: E-H Research Laboratories, Inc., Oakland, Calif.

[21] Appl. No.: 658,302

[22] Filed: Feb. 17, 1976

[51] Int. Cl.² .................... G01R 31/26; G01R 31/02
[52] U.S. Cl. ............................... 324/158 F; 339/75 M
[58] Field of Search ............ 324/158 F, 158 P, 158 R, 324/72.5; 339/75 M

[56] References Cited

U.S. PATENT DOCUMENTS

| | | | |
|---|---|---|---|
| 3,911,361 | 10/1975 | Bove et al. | 324/158 P |
| 3,963,986 | 6/1976 | Morton et al. | 324/158 F |

*Primary Examiner*—Rudolph V. Rolinec
*Assistant Examiner*—Ernest F. Karlsen
*Attorney, Agent, or Firm*—Flehr, Hohbach, Test, Albritton & Herbert

[57] ABSTRACT

Apparatus for testing electronic devices having a high density array of pin leads includes a zero insertion force socket having coaxial output leads with the inner conductor being a conductor pair with the coaxial lead terminating at a number of test heads. Each test head includes switching means for terminating the output coaxial lead in a characteristic impedance. The various test heads are then coaxially coupled, maintaining the two conductor inner lead pair, to more distant signal sources and receivers of both the ac and dc types to provide for Kelvin testing by separately connecting the inner conductor pair to power and sense devices or shorting the conductor pair together and conducting ac testing by use of pulsers and discriminators, or other dynamic test sources or sense devices such as sinewave devices.

3 Claims, 6 Drawing Figures

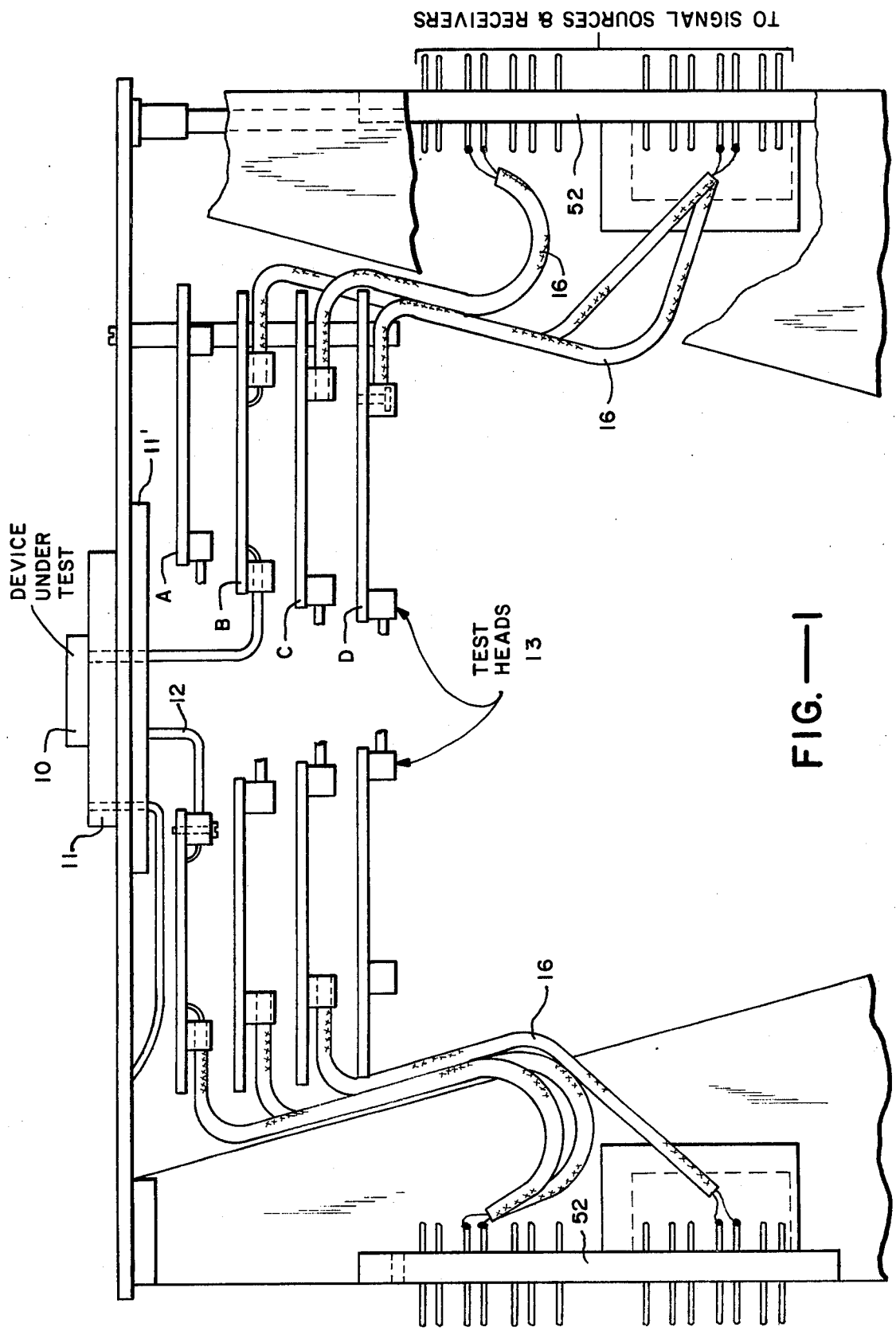

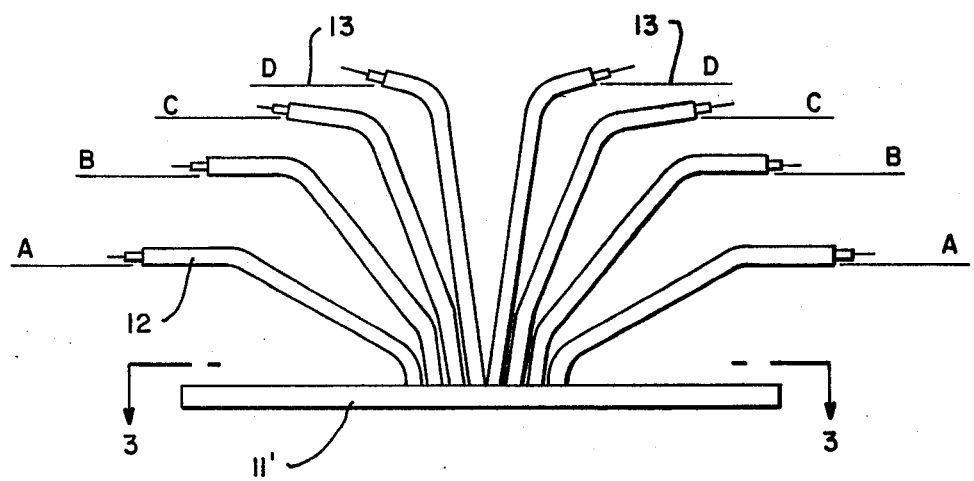
FIG.—2
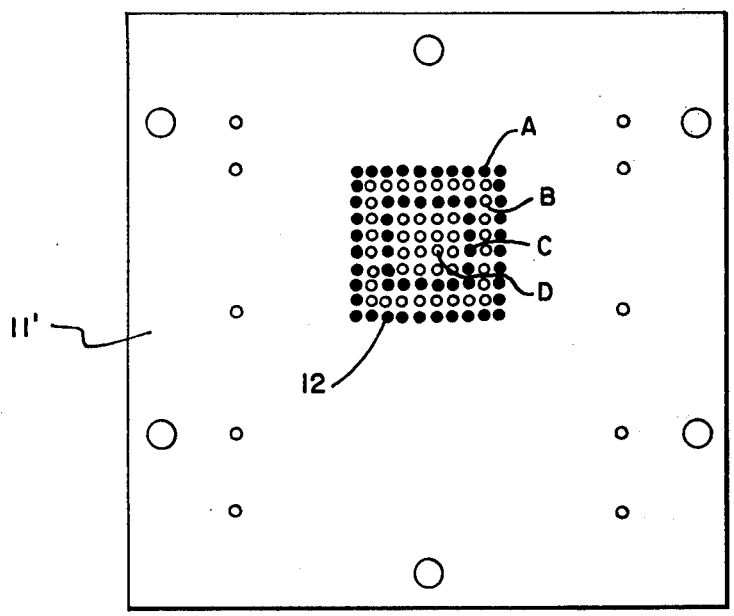
FIG.—3

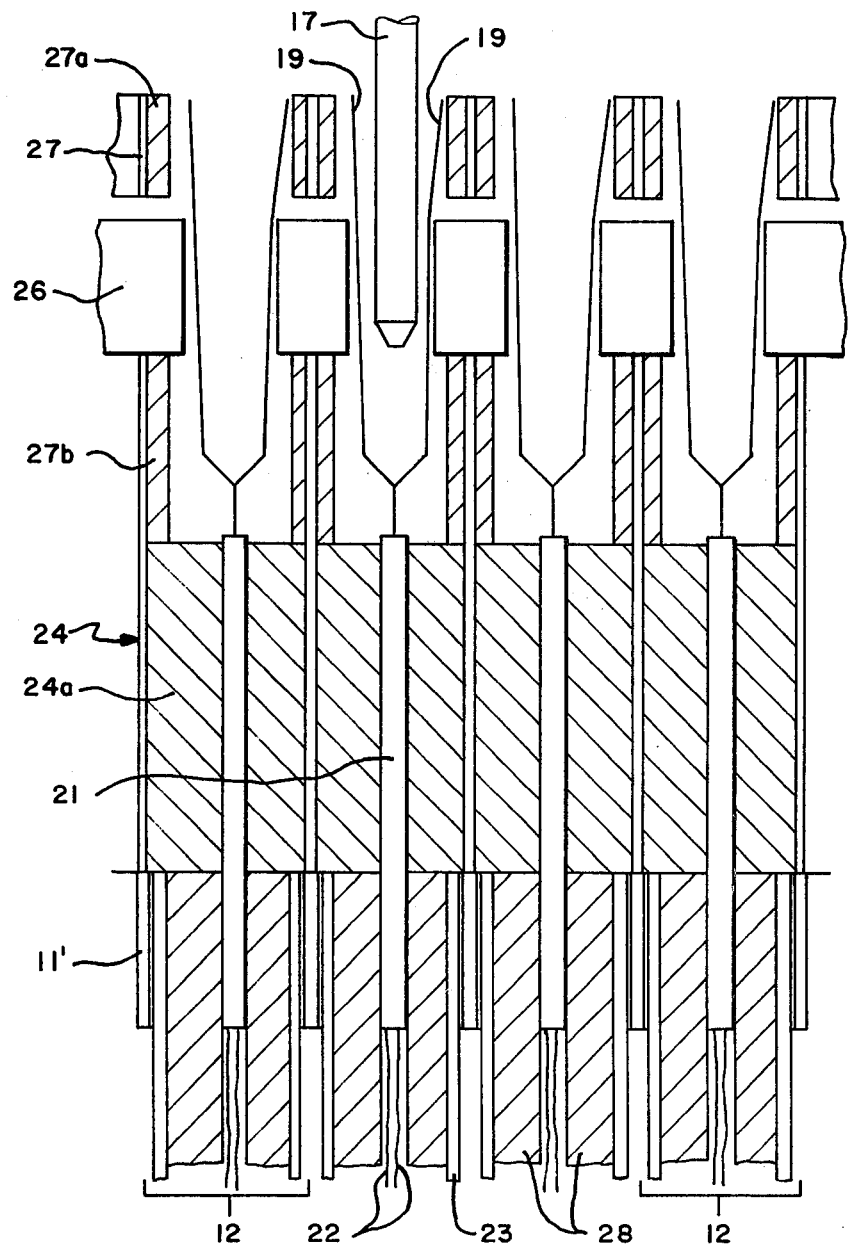
FIG.—4

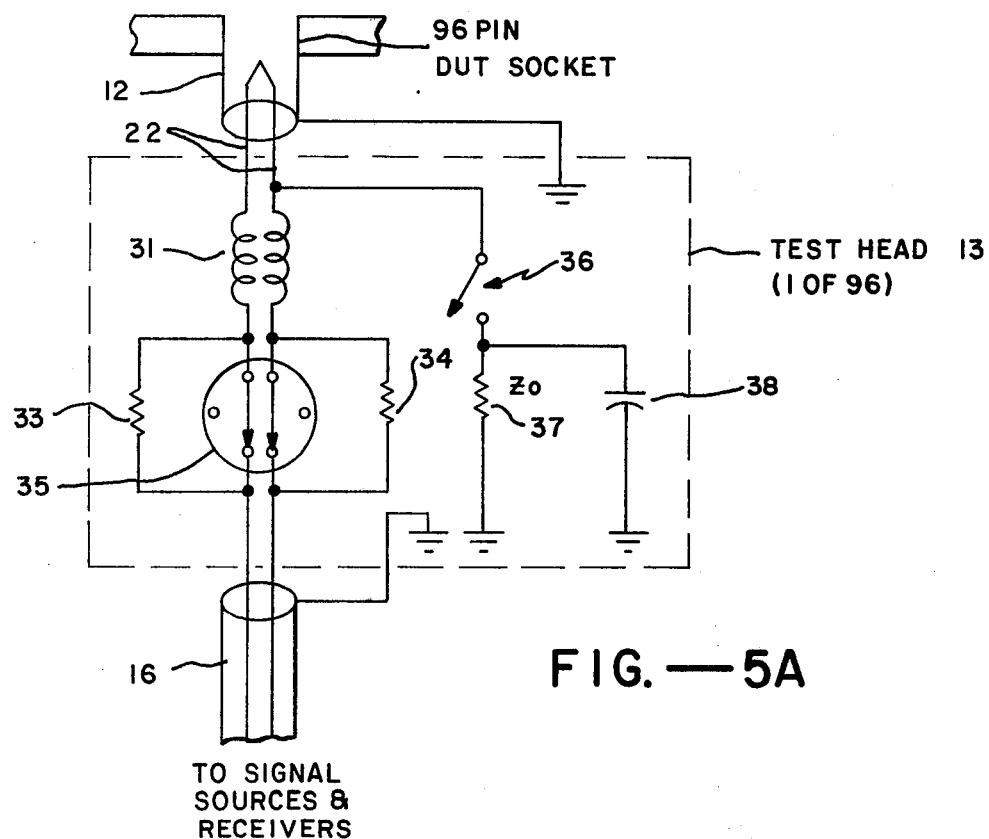
FIG.—5A
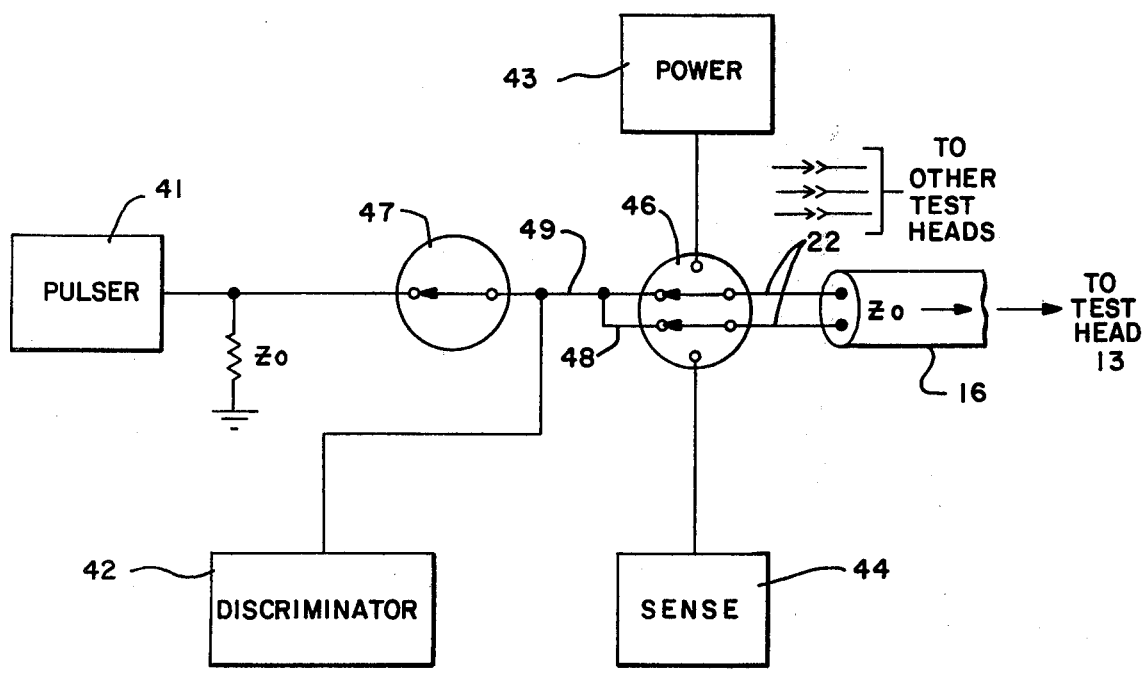
FIG.—5B

4,045,735

APPARATUS FOR TESTING ELECTRONIC DEVICES HAVING A HIGH DENSITY ARRAY OF PIN LEADS

BACKGROUND OF THE INVENTION

The present invention is directed to apparatus for testing electronic devices having a high density array of pin leads such as a monolithic large scale integrated circuit.

Such circuits as above may have as many as one hundred pin leads. It is relatively difficult to provide a suitable test socket for such a pin array. For example, copending patent application Ser. No. 573,625 filed May 1, 1975, now U.S. Pat. No. 4,012,009 in the name of John L. Worcester, one of the co-inventors of the present application, and assigned to the present assignee and entitled "Zero Insertion Force Socket and Method Therefor" discloses and claims an improved socket for testing high density pin lead electronic devices.

However, it is desirable to provide a universal testing system for both hybrid and full scale integrated circuits and also to provide for both ac and dc tests. The ac tests include tests of propagation time and on hybrid circuit chips a voltage test. In general, in ac pulse testing it may be desirable that the pin is either terminated or unterminated in the characteristic impedance depending on the type of test desired. The testing device as a whole may be looked at a transmission line. In a hybrid chip in order to produce a full imput voltage at the pin the line cannot be terminated at this point. However, on the other hand, for a time measurement there can be no reflection back to the input since this will otherwise make the measurement ambiguous. Thus, here the pin must be terminated.

In using a discriminator where measurement of the propagation time is being accomplished it is also desirable to prevent the loading down of the device under test by the discriminator. At the same time a proper termination is desirable to prevent secondary reflection.

Moreover, it is desirable to provide for universal dc testing by, for example, a Kelvin measurement technique which will compensate for lead resistance.

With a high density array of pins, capacitance problems are, of course, magnified. Also, it is difficult to gain access to the pins to test in a normal manner; for example, in a dc Kelvin test normally two separate leads are used to the pin itself in order to automatically cancel the effects of lead resistance in accordance with classical Kelvin bridge techniques.

OBJECTS AND SUMMARY OF THE INVENTION

It is, therefore, a general object of the present invention to provide improved apparatus for testing electronic devices having a high density array of pin leads.

It is a more specific object of this invention to provide apparatus as above which is capable of conducting both ac and dc tests on both large scale integrated circuits and hybrid circuits.

In accordance with the above objects there is provided apparatus for testing electronic devices having a high density array of pin leads. Test socket means receive the pin leads and have a plurality of coaxial output leads each corresponding to one of the pin leads. The coaxial leads have an array density corresponding to the pin lead density and each has an inner conductor pair insulated from one another and a characteristic impedance. A plurality of first switching means are in close proximity to the test socket means for selectively terminating the coaxial lines in the predetermined characteristic impedance. Signal sourcing and receiving means send and receive pulses and dc signals. A plurality of coaxial leads have an inner conductor pair insulated from one another for connecting the signal means to the coaxial output leads at the locations of the plurality of first switching means. Second switching means selectively connect the signal sourcing and receiving means to the connecting coaxial leads and short the inner conductor pairs.

BRIEF DESCRIPTION OF THE DRAWINGS

FIG. 1 is a simplified side view partially in cross section of apparatus embodying the present invention;

FIG. 2 is a more detailed elevation of a portion of FIG. 1;

FIG. 3 is a cross-section view taken substantially along line 3—3 of FIG. 2;

FIG. 4 is a detailed and enlarged cross-sectional view of a portion of FIG. 1; and FIGS. 5A and 5B are circuit diagrams embodying the present invention.

DETAILED DESCRIPTION OF THE PREFERRED EMBODIMENT

FIG. 1 shows a device under test 10 which, for example, may be a 96 pin large scale integrated circuit with its pins plugged into a device under test (DUT) socket 11. Such socket is disclosed and claimed in the above copending Worcester application.

Referring now also to FIG. 2 the base plate 11' of the socket is illustrated and has extending from it 96 coaxial leads 12 (only two of which are illustrated in FIG. 1) which terminate in four parallel planes containing circuit boards and designated A, B, C and D. The circuit boards are termed test heads and will be discussed in greater detail in conjunction with FIG. 5A. There are, of course, 96 separate test heads. As illustrated in FIG. 2, this flared array of coaxial leads 12 enables a number of test heads to be placed in fairly close physical proximity to the socket 11. In each of the planes A through D there are 24 test heads arranged in an annulus in that plane. Coupling the test heads 13 to signal sources and receivers which are shown in FIG. 5B, are additional connecting coaxial cables 16. Both the output coaxial cables 12 and the connecting coaxial cables 16 have a pair of inner conductors which are insulated from one another and twisted to provide a desired characteristic impedance in conjunction with the outer shield when the inner leads are shorted together as will be discussed below.

FIG. 3 illustrates the bottom plate 11' of the socket 11 and the cross-section of the coaxial leads 12 along with a designation of the various planes A through D to which the coaxial output leads extend or terminate. The array density of the leads 13 illustrated in FIG. 3 is substantially identical to the pin density of the semi-conductor device under test 10.

The details of the DUT socket 11 are illustrated in FIG. 4 and as discussed above are disclosed and claimed in the above Worcester copending application. Very briefly, a typical pin lead 17 of the device under test 10 is illustrated as extending into a connector jack 18 having two prongs 19 for receiving pin 17. The two prongs 19 terminate in a copper sleeve 21. Extending from the other end of each copper sleeve 21 are a pair of twisted insulated electrical leads 22 which form the inner conductor pair of a cylindrical conducting tube 23 and provide a characteristic impedance.

The overall structure of the socket 11 includes the base plate 11′, a bottom plate 24, a cam plate 26 and a top plate 27. Two of the plates contain apertures for receiving cylindrical plastic insulator sleeves 27a and b and 24a. When cam plate 26 is moved the pair of prongs 19 make electrical contact with the leads 17 to thus provide a zero insertion force socket in accordance with the above Worcester application. The output coaxial cable or lead 12 from the device under test socket 11 thus includes the outer conductor tube 23, the inner pair of insulated conductors 22 which are twisted, and the electrical insulation 28 which physically positions the conductor pair 22 in the center of tube 23.

FIG. 5A illustrates a typical test head 13 which of course is one of 96 test heads. It includes in series with the pair of inner conductors 22 a pair of inductors 31 and 32 for compensating for capacity at the socket and equalizing the characteristic impedance of the output coaxial cable 12 which, for example, in practice is 70 ohms with the characteristic impedance of the remainder of the circuit which is substantially 93 ohms. For example, this is the impedance of the coaxial lead 16. In series with each conductor 22 are also a pair of resistors 33 and 34 each having a nominal value of 180 ohms or in parallel 90 ohms. These are a dynamic series termination which may be selectively shorted out by switch 35. In addition, a switch 36 is connected to one of the conductors 22 to selectively switch in the grounded terminating impedance 37 which is designated Z hd o and is nominally the same impedance as the line 16. Switch or relay 36 acts as an isolation relay to remove the remaining circuitry from the test system so as not to add unnecessary parasitic capacitance. The capacitor 38 serves as a trim capacitor when this portion of the circuit is in operation.

FIG. 5B illustrates the signal sources and receivers which are used to provide the various ac and dc signals to test the device 10. These include a pulser unit 41 which may be a standard off-the-shelf pulse generator, for example, model No. 1501 manufactured by E-H Research, Inc. and a discriminator 42 which again may be a model No. 142 manufactured by E-H Research, Inc. The purpose of the discriminator is to measure propagation time. Both pulser 41 and discriminator 42 are for ac testing as is well-known in the art.

For dc testing there is a power source 43 for supplying a constant current of, for example, 1 milliampere. A dc voltmeter or sensing device 44 senses the voltage at a selected pin on the device under test and measures in the millivolts range. Connecting the inner conductor pair 22 of output coaxial lead 16 through the various signal sources and receivers are switching units 46 and 47. Switching unit 46 is a dual form C-type switch which in essence is two double pole, double throw switches which may connect the individual lines of the pair 22 to the power source 43 and the sensing unit 44 for a dc Kelvin measurement or alternatively as illustrated in FIG. 5B may connect the conductor pair 22 to a shorting connection 48 to present a single line 49 to either the pulser 41, discriminator 42 or both. The switch 47 switches the pulser in and out of the cirucit. Discriminator 42 may either present in a normal mode a high impedance or may be terminated in a characteristic impedance $Z_o$ through switch 47 and by turning off pulser 41.

The signal sources and receivers of FIG. 5B and the switch 46 are connected to the test heads 13 through the board connectors 52 illustrated in FIG. 1.

In operation, for ac testing it is important as illustrated in FIG. 5A to be able to provide either a terminated or unterminated condition by use of switch 36. For example, for hybrid circuit chips where full voltage is required there can be no termination. On the other hand, for time measurement using the discriminator 42 there can be no reflection back to the input since the discriminator may, for example, read a one-half voltage value. Therefore, the termination 37 is provided by means of switch 36 to prevent any ambiguity. In other words, a secondary reflection is prevented. In the case of FIG. 5B referring to the discriminator 42 per se, it can either be terminated by switch 47 or unterminated depending upon whether a low impedance integrated circuit device is being tested or another type of device. For example, a terminated line would normally draw or load down the device under test undesirably. The series resistors 33 and 34 illustrated in FIG. 5A prevent secondary reflection and are used only in the unterminated discriminator mode by opening shorting switch 35. For all pulser modes, the series resistors are shorted out by dualfrom C switch 35.

In the case of dc testing where a Kelvin bridge is desired since this eliminates lead resistance the point of commoning of the lead pair 22 is as illustrated in FIG. 4 as close as possible to the pin lead 17. This therefore, minimizes errors. At the same time, the conductor pair 22 is twisted together in the same coaxial shield 23 and they are maintained near the center of the transmission line to thereby maintain the characteristic impedance of the line.

Thus, an improved testing device for integrated circuit devices having high density pin arrays has been provided. Moreover, universal testing is achieved for both ac and dc modes of testing including a Kelvin bridge technique which minimizes lead resistance. Also the testing of hybrid chips has been made possible.

What is claimed is:

1. Apparatus for testing electronic devices having a high density array of pin leads comprising: test socket means for receiving said pin leads and having a plurality of output leads each corresponding to one of said pin leads said ouptut leads having an array density corresponding to said pin lead density, each of said output leads having an inner conductor pair insulated from one another and an outer shield; a plurality of first switcing means in close proximity to said test socket means for selectively terminating said output leads in a predetermined characteristic impedance; signal sourcing and receiving means for sending and receiving pulses and d.c. signals; a plurality of leads having an inner conductor pair insulated from each other and an outer shield for connecting to said output leads at the locations of said plurality of first switching means; second switching means for selectively connecting said signal sourcing and receiving means to said connecting leads and for shorting said inner conductor pairs to provide said characteristic impedance for said signal sourcing and receiving means.

2. Apparatus as in claim 1 where said signal sourcing and receiving means includes a constant direct current source and d.c. voltage sensing means and where said second switching means respectively connects one and the other of said inner conductor pairs of both said connecting and output leads to one and the other of said current source and d.c. voltage sensing means when said conductor pair of said lead is not shorted together whereby a d.c. Kelvin measurement is provided.

3. Apparatus as in claim 1 where said signal sourcing and receiving means includes a pulser and discriminator which said second switching means selectively connect to said shorted inner conductor pair of said connecting lead.

* * * * *